United States Patent
Burch et al.

(10) Patent No.: US 6,308,299 B1
(45) Date of Patent: Oct. 23, 2001

(54) METHOD AND SYSTEM FOR COMBINATIONAL VERIFICATION HAVING TIGHT INTEGRATION OF VERIFICATION TECHNIQUES

(75) Inventors: Jerry R. Burch, San Francisco; Vigyan Singhal, Fremont, both of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/118,199

(22) Filed: Jul. 17, 1998

(51) Int. Cl.[7] .................................................... G06F 17/50
(52) U.S. Cl. ........................................................ 716/4; 716/3
(58) Field of Search ............................................. 716/1–21

(56) References Cited

U.S. PATENT DOCUMENTS

| | | | |
|---|---|---|---|
| 5,469,367 | * | 11/1995 | Puri et al. ................................ 716/18 |
| 5,649,165 | * | 7/1997 | Jain et al. ................................. 716/5 |
| 5,754,454 | * | 5/1998 | Pixley et al. ........................... 702/123 |
| 5,949,691 | * | 9/1999 | Kurosaka et al. ....................... 716/5 |
| 5,974,242 | * | 10/1999 | Damarla et al. ......................... 716/2 |
| 6,026,222 | * | 2/2000 | Gupta et al. ............................. 716/5 |
| 6,035,107 | * | 3/2000 | Kuehlmann et al. .................... 716/1 |
| 6,059,837 | * | 5/2000 | Kukula et al. ......................... 703/27 |
| 6,086,626 | * | 7/2000 | Jain et al. ................................. 716/5 |

FOREIGN PATENT DOCUMENTS

409293087A * 11/1997 (JP) ................................ G06F/17/50

OTHER PUBLICATIONS

Huang et al. ("AQUILA: An Equivalence Verifier for Large Sequential Circuits", Jan. 1997, 6 pages).*
Wang et al. ("Restructuring binary decision diagrams based on functional equivalence", Proceedings of 4th European Conference on Design Automation, 1993, with the European Event in ASIC Design, Feb. 22, 1993.*

Krohm et al. ("The use of random simulation in formal verification", Proceedings of 1996 IEEE International Conference on Computer Design: VLSI in Computers and Processors, ICCD '96, Oct. 7, 1996, pp. 371–376.*
Berman et al. ("Functional comparison of logic designs for VLSI circuits", Digest of Technical Papers, 1989 IEEE International Conference on Computer Aided Design, 1989, ICCAD–89, Nov. 5, 1989, pp. 456–459.*

(List continued on next page.)

Primary Examiner—Matthew Smith
Assistant Examiner—Phallaka Kik
(74) Attorney, Agent, or Firm—Lyon & Lyon LLP

(57) ABSTRACT

A method and system for combinational verification tightly integrates multiple verification methods. The present invention performs random simulation on the inputs of two combinational netlists. The nets within the netlists are described as BDDs and divided into classes of cutpoint candidates based upon the signatures produced by the random simulation. Cutpoint candidates within each class are resolved to determine whether the candidates are equivalent. If the nets are likely to be equivalent, BDD composition is performed on the nets. Otherwise, SAT-based analysis is performed on the nets. If either method fails to resolve the cutpoints within an allocated amount of time or resources, then the other method is invoked and information learned by the first method is passed to the second method to assist in the resolution. This process repeats until the cutpoint candidates are resolved. If the cutpoint resolution produces a true negative, then the candidate classes are refined by performing directed simulation on the inputs of the netlists using the witness to the true negative generated by the cutpoint resolution. This directed simulation produces new candidate classes that are resolved as described above. If, after the cutpoint classes are refined, the outputs are in a different class, then the netlists are unequal. If a false negative is found after the cutpoints are resolved, a new cutpoint is created. If the outputs are in the current class, then the two netlists are equal. Otherwise, the cutpoints are further resolved as described above.

30 Claims, 10 Drawing Sheets

OTHER PUBLICATIONS

C. A. J. van Eijk; Formal Methods for the Verification of Digital Circuits; Sep. 1997, pp. 1–143.

R. Mukherjee et al.; Flover: Filtering Oriented Combinational Verification Approach; May 1997; NWLS '97: Synthesis in the Sierra; Work Shop Notes Vol. 1.

A. Kuehlmann et al.; Equivalence Checking Using Cuts and Heaps; DAC 97; 1997; pp. 263–268, Jan. 1997.

W. Kunz et al.; A Novel Framework for Logic Verification in a Synthesis Environment; IEEE: Trans. on Comp.–Aided Design of Inte. Cir. and Syst.; vol. 15, No. 1; Jan. 1996; pp. 20–32.

Y. Matsunaga; An Efficient Equivalence Checker for Combinational Circuits; $33^{rd}$ Design Automation Conference; 1996; pp. 629–634, Jan. 1996.

D.K.Pardhan et al.; Verilat: Verification Using Logic Augmentation and Transformations; 1996; IEEE; pp. 88–95, Nov. 10, 1996.

J. Jain et al.; Advance Verification Techniques Based on Learning; $32^{nd}$ Design Automation Conference; Jun. 1995; pp. 420–426.

A. Gupta et al.; Integrating a Boolean Satisfiability Checker and BDDs for Combinational Equivalence Checking; VLSI Design '98; 1997; pp. 222–225.

C.A.J. van Eijk; Exploiting Structural Similarities in a BDD–Based Verification Method; Jan. 1994.

D. Brand; Verification of Large Synthesized Designs; 1993 IEEE/ACM International Conference on Computer–Aided Design; Digest of Technical Papers; pp. 534–537, Nov. 11, 1993.

B. Selman et al.; A New Method for Solving Hard Satisfiability Problems; AAAI–92 Proceedings; Tenth National Conference on Artificial Intelligence; 1992; pp. 440–446, Jul. 12, 1992.

E. Sentovich et al.; Sequential Circuit Design Using Synthesis and Optimization; 1992 IEEE Int'n. Conf. on Computer Design: VLSI in Computers & Processors; pp. 328–333, Oct. 11, 1992.

C.L. Berman; Functional Comparison of Logic Designs for VLSI Circuits; 1989 IEEE Int'n Conf. On Computer–Aided Design; Digest of Technical Papers; pp. 456–459, Nov. 5, 1989.

R. Bryant; Graph–Based Algorithms for Boolean Function Manipulation; IEEE Transactions on Computers; vol. C–35; No. 8; Aug. 1986; pp. 677–691.

S–Y. Huang; Aquila: An Equivalence Verifier for Large Sequential Circuits; 1997, Jan. 1997.

* cited by examiner $Y_1(\overline{Y}_2 + X_2)(X_1 + X_5)$ $Y_1 \equiv [\overline{X}_5 Y_3 (X_2 + X_3)]$ $Y_2 \equiv [X_2 + X_4]$ $Y_3 \equiv [\overline{X}_5 + X_6]$

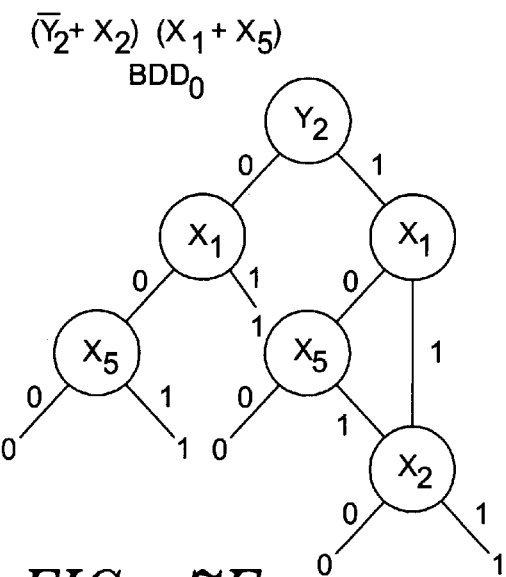
FIG. 7E
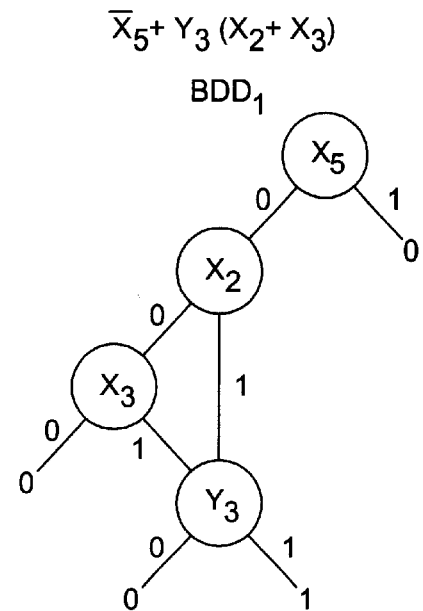
FIG. 7F
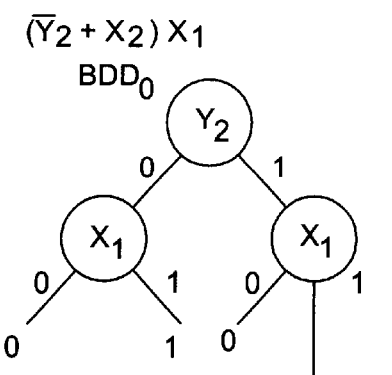
FIG. 7G
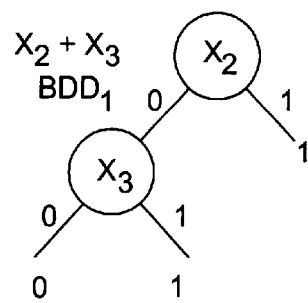
FIG. 7H
BDD$_3$    1
FIG. 7I
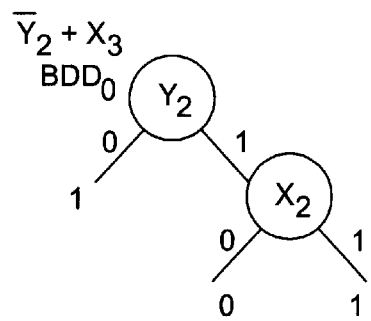
FIG. 7J

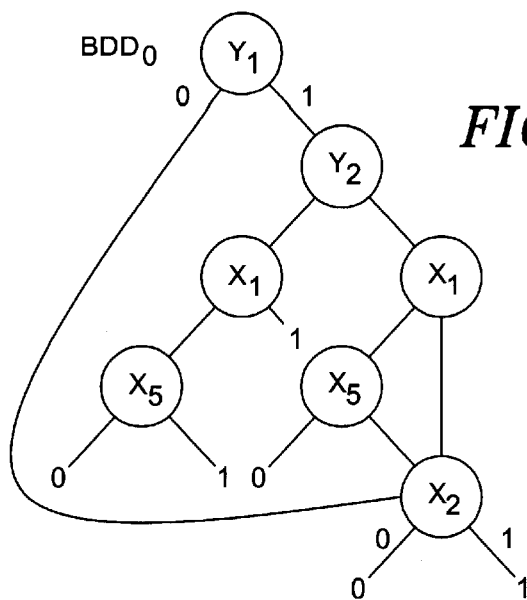

FIG. 8A

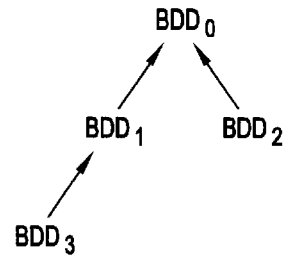

FIG. 8B

| | | | | | | | | | |
|---|---|---|---|---|---|---|---|---|---|
| $Y_1 = 1$: | 1 | + | 4 | + | 2 | + | 2 | = | 9 |
| | $BDD_0$ NEEDED | | $BDD_1$ WASTED | | $BDD_2$ WASTED | | $BDD_3$ WASTED | | |
| $Y_2 = 0$: | 0 | + | 1 | + | 0 | + | 2 | = | 3 |
| | $BDD_0$ NEEDED | | $BDD_1$ NEEDED | | $BDD_2$ UNNEEDED | | $BDD_3$ WASTED | | |
| $Y_3 = 0$: | 0 | + | 0 | + | 0 | + | 1 | = | 1 |
| | $BDD_0$ NEEDED | | $BDD_1$ NEEDED | | $BDD_2$ UNNEEDED | | $BDD_3$ NEEDED | | |
| $X_1 = 1$: | 0 | + | 1 | + | 0 | + | 2 | = | 3 |
| | $BDD_0$ NEEDED | | $BDD_1$ NEEDED | | $BDD_2$ UNNEEDED | | $BDD_3$ WASTED | | |
| $X_2 = 0$: | 1 | + | 4 | + | 2 | + | 2 | = | 9 |
| | $BDD_0$ NEEDED | | $BDD_1$ WASTED | | $BDD_2$ WASTED | | $BDD_3$ WASTED | | |
| $X_3 = 1$: | 0 | + | 1 | + | 0 | + | 2 | = | 3 |
| | $BDD_0$ NEEDED | | $BDD_1$ WASTED | | $BDD_2$ UNNEEDED | | $BDD_3$ WASTED | | |
| $X_4 = 0$: | 0 | + | 1 | + | 0 | + | 2 | = | 3 |
| | $BDD_0$ NEEDED | | $BDD_1$ WASTED | | $BDD_2$ UNNEEDED | | $BDD_3$ WASTED | | |
| $X_6 = 1$: | 0 | + | 1 | + | 0 | + | 2 | = | 3 |
| | $BDD_0$ NEEDED | | $BDD_1$ WASTED | | $BDD_2$ UNNEEDED | | $BDD_3$ WASTED | | |
| $X_5 = 1$: | 0 | + | 0 | + | 0 | + | 1 | = | 1 |
| | $BDD_0$ NEEDED | | $BDD_1$ WASTED | | $BDD_2$ UNNEEDED | | $BDD_3$ NEEDED | | |

FIG. 8C

METHOD AND SYSTEM FOR COMBINATIONAL VERIFICATION HAVING TIGHT INTEGRATION OF VERIFICATION TECHNIQUES

BACKGROUND OF THE INVENTION

1. Field of the Invention

This invention pertains in general to equivalence checking tools and in particular to a method and system for combinational verification using multiple verification techniques.

2. Description of Background Art

In the field of digital electronics, it is often necessary to determine whether two digital circuit designs are functionally equivalent to each other. Circuits consist of combinational and sequential storage elements. The equivalence determination can be achieved by comparing corresponding combinational blocks of the two circuits. Logic techniques are used to achieve this comparison.

Given two combinational netlists representing combinational blocks of circuits, which have the same sets of inputs and outputs, combinational verification determines if, for every possible input combination, the outputs of the netlists evaluate to the same Boolean value. This problem is known to be coNP-hard, but several real-world techniques have been developed to solve it.

The design methodology which is responsible for deriving one circuit design from the other virtually assures that, besides the pairs of corresponding outputs of the netlists, many internal net pairs should also be equivalent. These equivalent net pairs are called "cutpoints." By decomposing the combinational verification into smaller problems through the use of cutpoints, combinational verification can be performed on complex netlists.

The central idea behind decomposing the problem into smaller problems using cutpoints is that if $f_1(x)=g_1(x)$ for all values of the input vector x, and if $f_2(y,z)=g_2(y,z)$ for all values of y and z, then $f_2(f_1(x),z)=g_2(g_1(x),z)$ for all values of x and z. However, the converse is not true, namely, if $f_2(y,z) \neq g_2(y,z)$, we cannot say whether $f_2(f_1(x),z)$ equals $g_2(g_1(x),z)$. This unknown is termed the "false negative problem." There are two possible resolutions of this problem: either $f_2$ and $g_2$ are not equivalent (a real negative), or $f_2$ and $g_2$ are equivalent (a false negative). The process of resolving this unknown is called "cutpoint resolution."

One approach to cutpoint resolution uses binary decision diagrams (BDDs) to represent the netlists. A BDD represents a function as a rooted, directed, acyclic graph, with each non-terminal node labeled by a function variable. Each non-terminal node has two outgoing edges, corresponding to the cases where the function variable evaluates to zero or one. The terminal nodes are labeled with zero or one, corresponding to possible function values. For any assignment to the variables, the function value is determined by tracing a path from the root to a terminal node by following the appropriate branch from each node.

In a BDD-based approach, cutpoints are introduced, and intermediate functions are represented as f(X, Y), where $X=\{x_1,x_2,\ldots,x_n\}$ is the set of variables denoting primary inputs and $Y=\{y_1,y_2,\ldots,y_l\}$ is the set of variables denoting the cutpoints. Each $y_i \in Y$ is associated with a BDD representing its function $$h_i(X, \{y_{[i+1]}, \ldots, y_l\}),$$

wherein $y_i$'s are in increasing order from the outputs toward the inputs and $y_j$ cannot depend on $y_k$ if $k \leq j$. If two BDDs f(X, Y) and g(X, Y) are not equal, a cutpoint resolution problem exists.

The resolution can be obtained by starting with the BDD for $[f(X,Y) \neq g(X,Y)]$ and then iteratively composing the cutpoints until the resulting BDD is independent of $y_i$'s. A composition is achieved using the BDD-compose operation first described by R. Bryant, Graph-based Algorithms for Boolean Function Manipulation, *IEEE Transactions on Computers*, 1 C-35:677–691, August 1986, which is hereby incorporated by reference herein. This operation composes $y_i$ into s(X,Y), which represents $$\exists y_i : s(X, Y) \wedge (y_i \equiv h_i(X, \{y_{[i+1]}, \ldots, y_l\})).$$

If, after all compositions, the final BDD represents zero, a false negative exists. If the final BDD represents one, a true negative exists.

Heuristics for selecting cutpoints are very important in a compositions-based method. To this end, C. A. J. van Eijk, Formal Methods for the Verification of Digital Circuits, Eindhoven: Technische Universiteit Eindhoven, 1997, presents heuristics to select cutpoints so the cutpoint resolution problem does not occur often or is not too difficult to resolve. These heuristics assume that a node is a good cutpoint if its number of fanouts is large or if it is evenly spaced between other cutpoints. Another heuristic, described in Y. Matsunaga, "An efficient equivalence checker for combinatorial circuits," *Proceedings of the 33th ACM/IEEE Design Automation Conference*, pp. 629–634, June 1996, determines the order in which cutpoints are composed.

The process of successive composition does not work well if the two candidate netlists are actually unequal (the true negative case). The inequality cannot be determined until a sufficient number of cutpoints have been composed such that primary input variables appear in the BDD. This process is extremely computationally expensive. The system can be configured to threshold the composition scheme by a maximum BDD size, but such a technique results in slower execution and may miss real cutpoints. Since many resolutions yield true negatives, especially when the designs are not equivalent, it is important for the equivalence checker to be equally robust for both the true and false negative cases.

Another approach to combinational verification using cutpoints, described by D. Brand, Verification of Large Synthesized Designs, *Proc. Int'l Conference on Computer-Aided Design*, 534–537, 1993, uses automatic test pattern generation (ATPG) techniques. An ATPG technique decides the equality of two functions, by determining if there exists a test pattern that tests the presence of a stuck-at-zero fault at the exclusive-or of the two functions. If the technique determines that such a test pattern exists, the function from one circuit is substituted in place of the function in the other circuit. This approach, however, is less effective than BDD-based methods when the required test pattern does not exist. Thus, many approaches use the ATPG-based algorithm only when the standard BDD-based algorithm fails.

The observations that different methods were strong on different classes of circuits prompted approaches using filters. One approach uses a set of combinational verification engines as filters through which the problem instances pass. This approach works well on a large class of circuits;

however, if an unsuitable method is applied before the most suitable method, it can be very computationally expensive.

Another, more advanced, approach is to dovetail between the different verification methods to make the problem instance pass through methods with increasing resolution thresholds. The motivation for this approach is that dovetailing avoids committing to using a method on an instance for which the method is not suited. However, this approach still has limitations which can be understood by comparing the performance of this approach with an imaginary tool which uses an oracle; when presented with an equivalence check problem, this oracle magically picks the best method to solve this problem. The dovetail approach necessarily performs worse than the oracle, since the dovetail approach will waste effort on incorrect methods.

Even the oracle, however, can only choose between discrete methods to apply to the problem. The performance of the oracle can be beat, therefore, by allowing methods to work together on a problem and share information among the methods.

Accordingly, there is a need in the art for a method and system of combinational verification that allows multiple methods to work on a problem and share information among the methods. Such methods should preferably be tightly integrated and the method and system should be robust for both the positive and the negative problem instances.

SUMMARY OF THE INVENTION

The above needs are met by a method and system for combinational verification that tightly integrates multiple verification methods. The present invention first performs random simulation on the inputs of two combinational netlists. The random simulation causes values to form at nets within the netlists. These values are analyzed and the nets are divided into classes based upon the patterns of values, or signatures, in the nets. All of the nets within each class are cutpoint candidates.

Next, pairs of the cutpoint candidates are described as BDDs and cutpoint candidates within each class are resolved to determine whether the candidates are equivalent (false negatives) or inequivalent (true negatives). Structural analysis is performed on the nets to determine whether the nets are likely to be equivalent. If the nets are likely to be equivalent, BDD composition is performed on the BDDs in order to identify false negatives. If the BDDs are not likely to be equivalent, satisfiability-(SAT-) based analysis is performed on the BDDs in order to identify true negatives. Initially, either BDD composition or SAT analysis is invoked with one root BDD and p cutpoint candidate BDDs. However, if either method fails to resolve the cutpoints within an allocated amount of time or resources, then the other method is invoked with the reduced set of m root and p cutpoint BDDs generated by the prior method. This process repeats until the cutpoints are resolved.

BDD-composition entails starting with the m root and p cutpoint BDDs and composing the variable that increases the root BDD size the least. If there is only one root BDD and a path of only input variables from the root to the BDD-leaf representing "1" is found, a true negative has been found and cutpoint resolution stops. Otherwise, if there is only one root BDD and a BDD representing "0" is found, the cutpoint candidates are true cutpoints (a false negative).

SAT-based analysis takes the m root and p cutpoint BDDs in terms of variables representing primary inputs and other variables representing cutpoints and returns an assignment satisfying all of the BDDs. A satisfying assignment associates a Boolean value for each variable in $X \cup Y$ such that each of the m root BDDs $s_i(X,Y)$ evaluates to one, and so does each of the p BDDs representing the cutpoints $$[y_i \equiv h_i(X, \{y_{[i+1]}, \ldots, y_l\})].$$

In order to do a cutpoint resolution between f(X,Y) and g(X,Y), the analysis invokes the SAT-based algorithm with only one root BDD $s_1(X,Y)$ set to $[f(X,Y) \neq g(x,Y)]$.

If cutpoint resolution by either method produces a true negative, the candidate classes are refined by performing directed simulation on the inputs of the netlists using the witness to the true negative. If the true negative was found using BDD composition, the witness is the paths of the BDD which represent all input minterms showing the real negative. On the other hand, if the true negative was found using SAT analysis, the witness is the input cube showing the true negative. This directed simulation produces new candidate classes that are resolved as described above. If, after the cutpoint classes are refined, the outputs are in different classes, the netlists are unequal and the test pattern showing the inequality is returned.

If the cutpoint resolution produces a false negative (i.e., the two nets are equivalent), a new cutpoint is created. If the outputs are in the current class, then the two netlists are equal. Otherwise, the cutpoints are further resolved as described above.

BRIEF DESCRIPTION OF THE DRAWINGS

FIG. 8 illustrates various figures explaining the cost function used in SAT-based resolution.

DETAILED DESCRIPTION OF THE PREFERRED EMBODIMENTS

The present invention is a combinational verification engine using a combination of binary decision diagram (BDD)-based methods, search algorithms, and test pattern simulation at a fine grain to provide balance between positive and negative verification.

Figure 1:
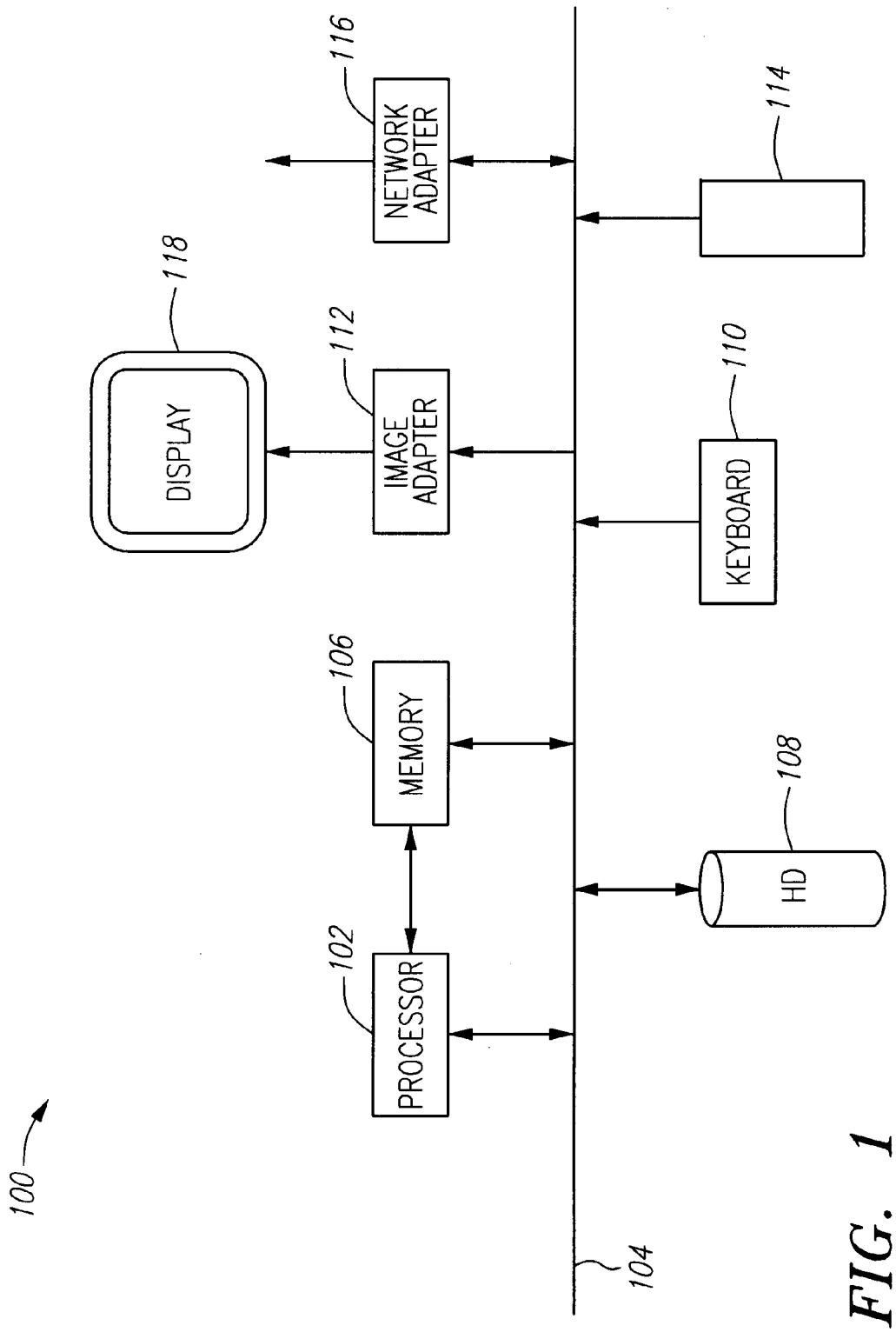
FIG. 1 is a high-level block diagram illustrating a computer system for performing combinational verification according to an embodiment of the present invention.

FIG. 1 is a high-level block diagram illustrating a computer system 100 for performing combinational verification according to one embodiment of the present invention. Illustrated are at least one processor 102 coupled to a bus 104. Also coupled to the bus 104 are a memory 106, a storage device 108, a keyboard 110, a graphics adapter 112, a pointing device 114, and a network adapter 116. A display 118 is coupled to the graphics adapter 112.

The at least one processor 102 may be any general-purpose processor such as an INTEL x86 compatible central processing unit (CPU). The storage device 108 may be any device capable of holding large amounts of data, like a hard drive, compact disk read-only memory (CD-ROM), digital versatile disk (DVD), or some form of removable storage device. The memory 106 holds instructions and data used by the processor 102. The pointing device 114 may be a mouse, track ball, light pen, touch-sensitive display, or other type of pointing device and is used in combination with the keyboard 110 to input data into the computer system 100. The graphics adapter 112 displays images and other information on the display 118. The network adapter 116 couples the computer system 100 to a local or wide area network (not shown).

A program for performing combinational verification according to one embodiment of the present invention is preferably stored on the storage device 108, loaded to the memory 106, and executed on the processor 102. Alternatively, hardware or software modules may be stored elsewhere within the computer system 100 for performing the method steps described herein.

Figure 2:
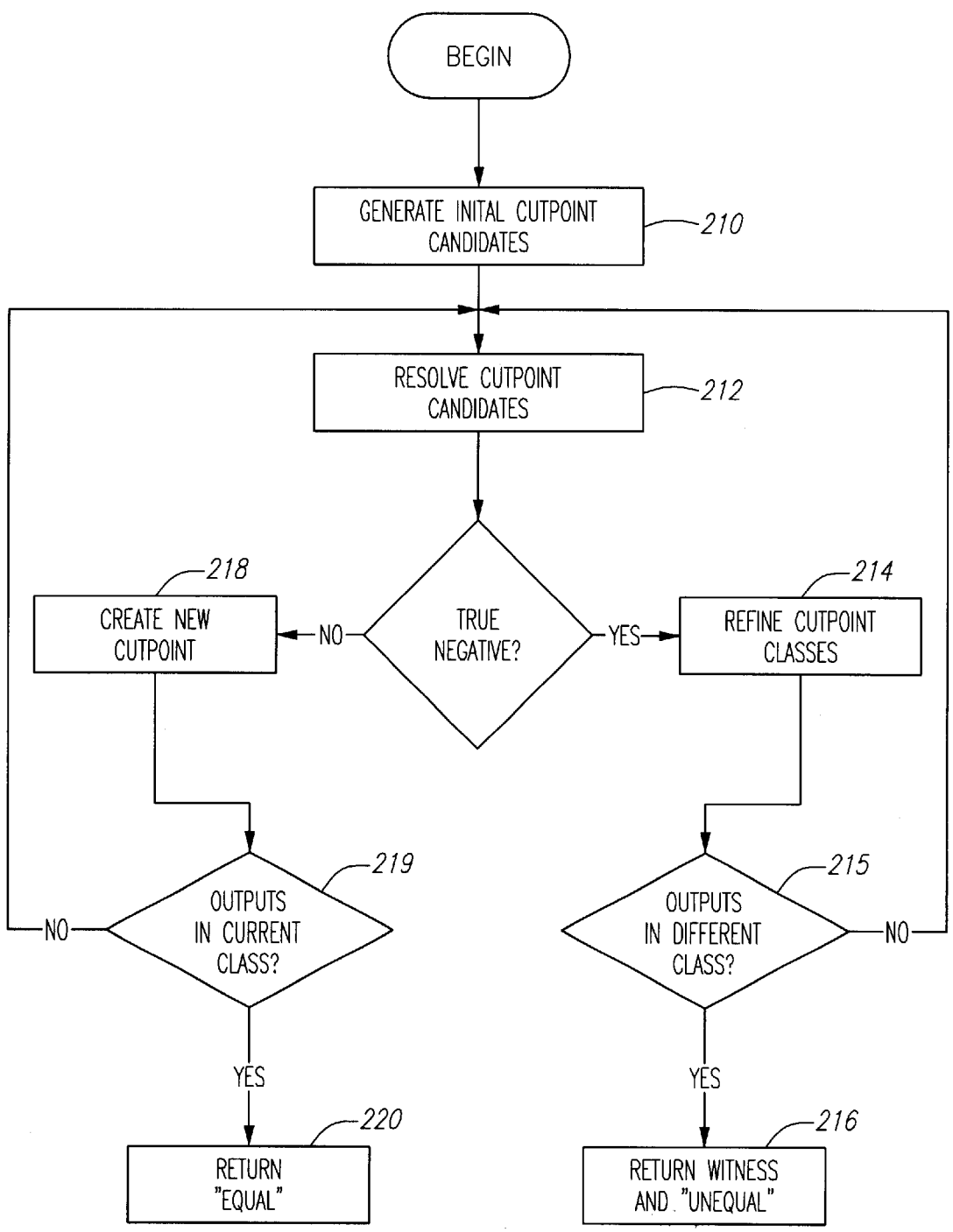
FIG. 2 is a flow chart illustrating steps for performing combinational verification of two combinational netlists having the same sets of inputs and outputs according to an embodiment of the present invention.

FIG. 2 is a flow chart illustrating steps for performing combinational verification of two combinational netlists having the same sets of inputs and outputs according to one embodiment of the present invention. First, classes of cutpoint candidates are generated 210 by running random simulation of test vectors on the inputs. After simulation, the values of the nets in the netlists are examined. Two nets belong to the same class if they have the same signature, or pattern of values. Accordingly, the nets in each netlist are placed 210 in a class of cutpoint candidates depending on the nets' signatures produced by the random simulation vectors.

Each pair of cutpoints candidates in each cutpoint class are resolved 212. Resolving a cutpoint means to determine whether the pair of cutpoint candidates are equivalent (a false negative) or inequivalent (a true negative). If the cutpoint resolution 212 indicates that a pair of cutpoint candidates is inequivalent, the resolution stops and the classes originally created with random simulation are refined 214 in order to produce new classes of cutpoint candidates.

If, after the classes are refined, the outputs of the netlists are in different classes (i.e., have different signatures), the two circuits represented by the netlist are inequivalent. Accordingly, the witness or input pattern showing the inequivalency is returned 216. Otherwise, the cutpoint candidates in the newly refined classes are resolved 212. If the cutpoint resolution 212 indicates that all of the cutpoint candidates in a class are equivalent (i.e., a false negative), a new cutpoint is created from the cutpoint candidates 218. If the outputs for the netlists are in the current class of candidates 219, netlists have been analyzed completely and the circuits have been determined to be equivalent 220. Otherwise, the remaining cutpoint candidates in each class are resolved 212.

Figure 3:
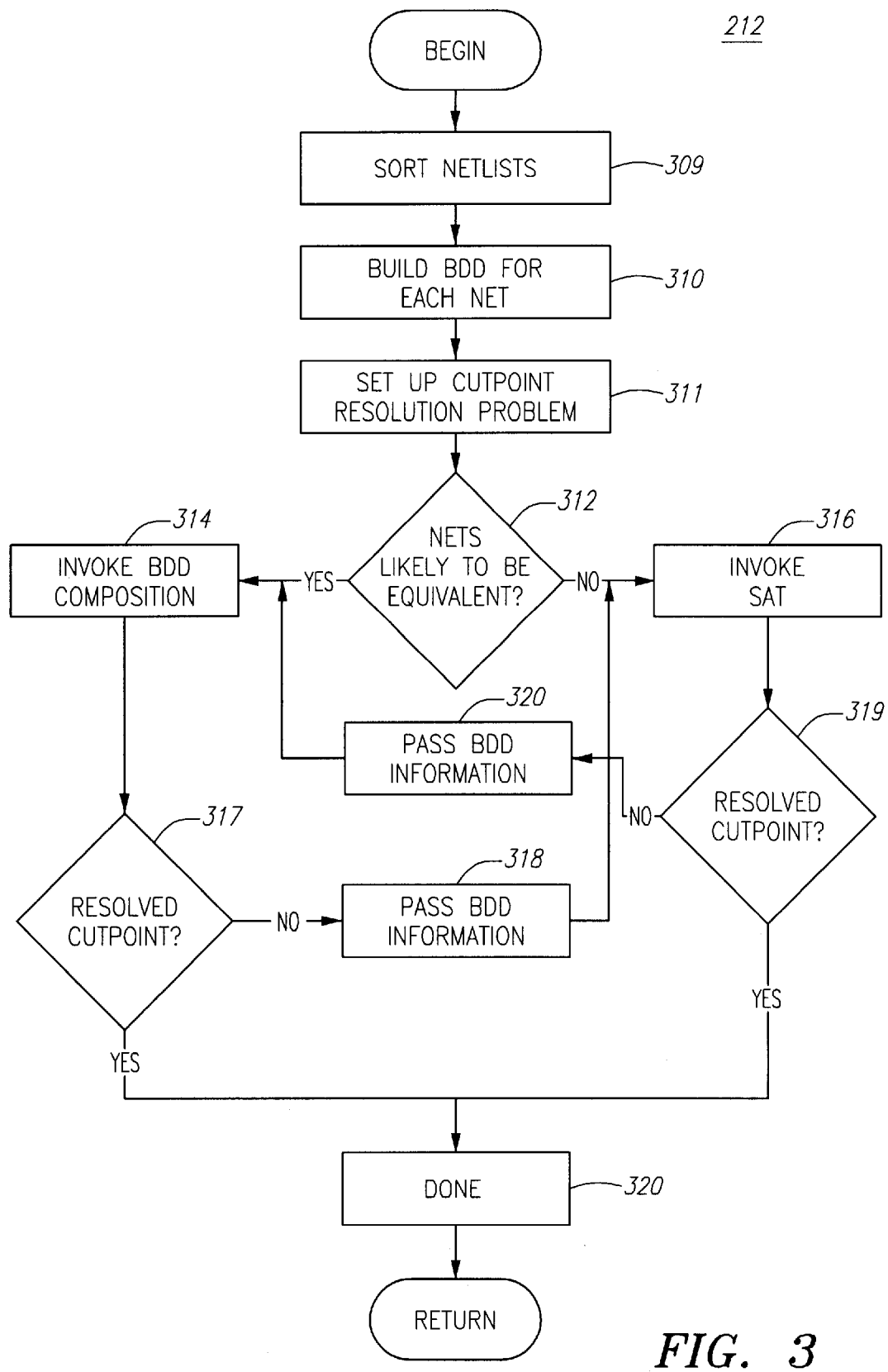
FIG. 3 is a flow chart illustrating steps for performing cutpoint resolution according to an embodiment of the present invention.

FIG. 3 is a flow chart illustrating steps for performing cutpoint resolution according to an embodiment of the present invention. Preferably, the nets within each netlist are sorted 309 in, for example, a depth-first order from the inputs to the outputs. Then, a binary decision diagram (BDD) is built 310 for each net. Each BDD is described in terms of input variables and other variables representing previously discovered cutpoints, if any.

Each pair of BDDs in a class is set up 311 as a cutpoint resolution problem in the sorted order. Thus, suppose that the nets of a netlist G are sorted. For each net g in G, the net g is set up as a cutpoint resolution problem with the sorted nets in the other netlist in the same class as g. A pair of BDDs, one from each netlist, is described as f(X,Y) and g(X,Y), respectively, where X is the set of input variables and Y is the set of cutpoint variables. The cutpoint resolution problem is described by one root BDD representing [f(X,Y)≠g(X,Y)] and p cutpoint BDDs, each representing the BDD for the i-th cutpoint $$[y_i \equiv h_i(X, \{y_{\{i+1\}}, \ldots, y_l\})].$$

The cutpoint candidates are not equal if and only if there is an assignment to the variables in X and Y which satisfies each of these (p+1) BDDs (i.e., makes each BDD evaluate to one).

Then, structural analysis is performed 312 on the class to determine whether the nets are likely to be equivalent. For example, if the signature of the class is all-zero or all-one, the nets are unlikely to be equivalent because the input vectors generated by the random simulation have probably not penetrated this deeply into the netlist. Likewise, if the structural support of the two nets in terms of the circuit inputs is different, then the nets are unlikely to be equivalent.

If the nets are likely to be equivalent, BDD composition is invoked 314 on the nets in the candidate class. If the BDD composition terminates without resolving 317 a cutpoint, the current set of m root and p cutpoint BDDs is passed 318 to the Satisfiability-(SAT-) based method.

If the structural analysis reveals that the nets are not likely to be equivalent or the BDD composition 314 fails to resolve the cutpoint, the SAT-based method is invoked 316. If the SAT-based method is invoked due to the structural analysis, then it starts with one root and p cutpoint BDDs. If the SAT-based method is invoked 316 because the BDD composition 314 failed to resolve the cutpoint, the SAT-based method receives 318 the set of m root and p cutpoint BDDs produced by the BDD composition. If the SAT method does not resolve 319 the cutpoint, the BDD composition method 314 is invoked to resolve the cutpoint and the reduced set of m root and p cutpoint BDDs produced by the SAT-based method is passed 320 back to the BDD composition. These invoking 314, 316 and passing 318, 320 steps are repeatedly invoked until the cutpoint is resolved.

Figure 4:
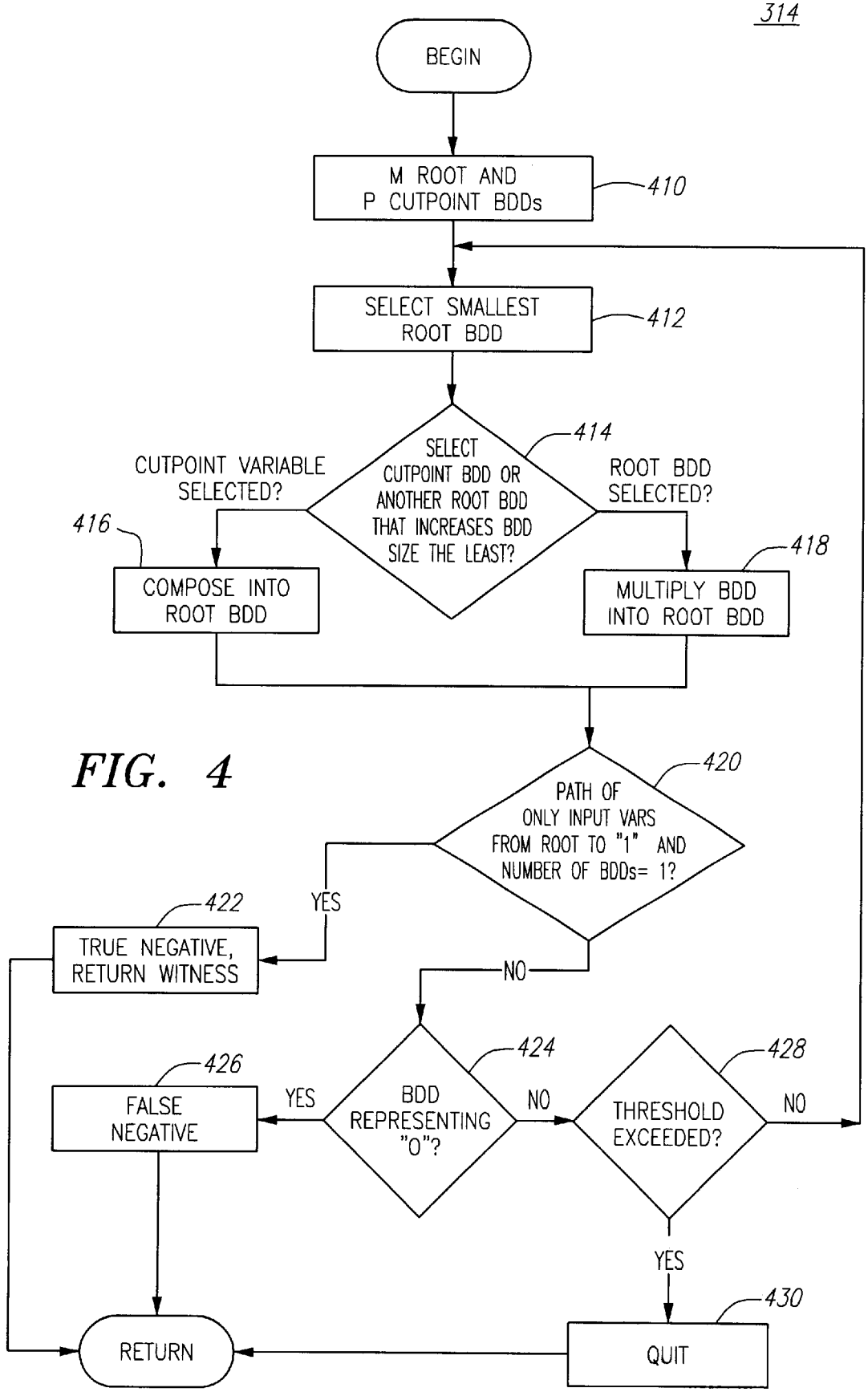
FIG. 4 is a flow chart illustrating steps for performing BDD composition according to an embodiment of the present invention.

FIG. 4 is a flow chart illustrating steps for performing BDD composition 314 according to a preferred embodiment of the present invention. As stated above, BDD composition starts with the m root and p cutpoint BDDs.

The smallest of the root BDDs (i.e., the root BDD having the fewest nodes) is selected for composition 412. The order in which the cutpoint BDDs of the selected root BDD are composed is important because the wrong order might cause the elimination of all cutpoints, including the cutpoints that do not cause false negatives. Therefore, a preferred embodiment of the present invention uses a heuristic to determine the order in which the cutpoints are composed. The heuristic is driven by a cost function that biases the system towards composing those cutpoints which cause the smallest increase in the BDD size. According to this heuristic, a second BDD (which may be either a cutpoint BDD or another root BDD) is chosen 414 so that the union of the number of BDD variables of the first selected BDD and this new BDD is minimized. While this heuristic often composes a cutpoint variable more than once, the heuristic has been found to perform better than if it were to compose cutpoint variables in the order of their distance to the potential cutpoint. If the heuristic selects a cutpoint BDD, the cutpoint variable is composed into the root BDD 416. Otherwise, the selected root BDD is multiplied into the previously selected smallest root BDD 418.

BDD composition stops if there is only one root BDD and a path is found from the root node of that BDD to the BDD-leaf representing one and the path contains only input variables 420. If such a path is found, the assignment to the variables on the path comprises a negative (i.e., shows the inequivalence between the cutpoint candidates). Accordingly, a true negative has been found. As a result, the witness for the true negative is returned so that it can be used for further candidate class refinement 422.

If a BDD representing zero is obtained 424, a false negative has been found 426, i.e., f is equivalent to g and represent a cutpoint. If the BDD composition exceeds the BDD size limit or otherwise exceeds the resources allocated for this iteration of BDD composition 428, then the BDD composition terminates 430.

Figure 5:
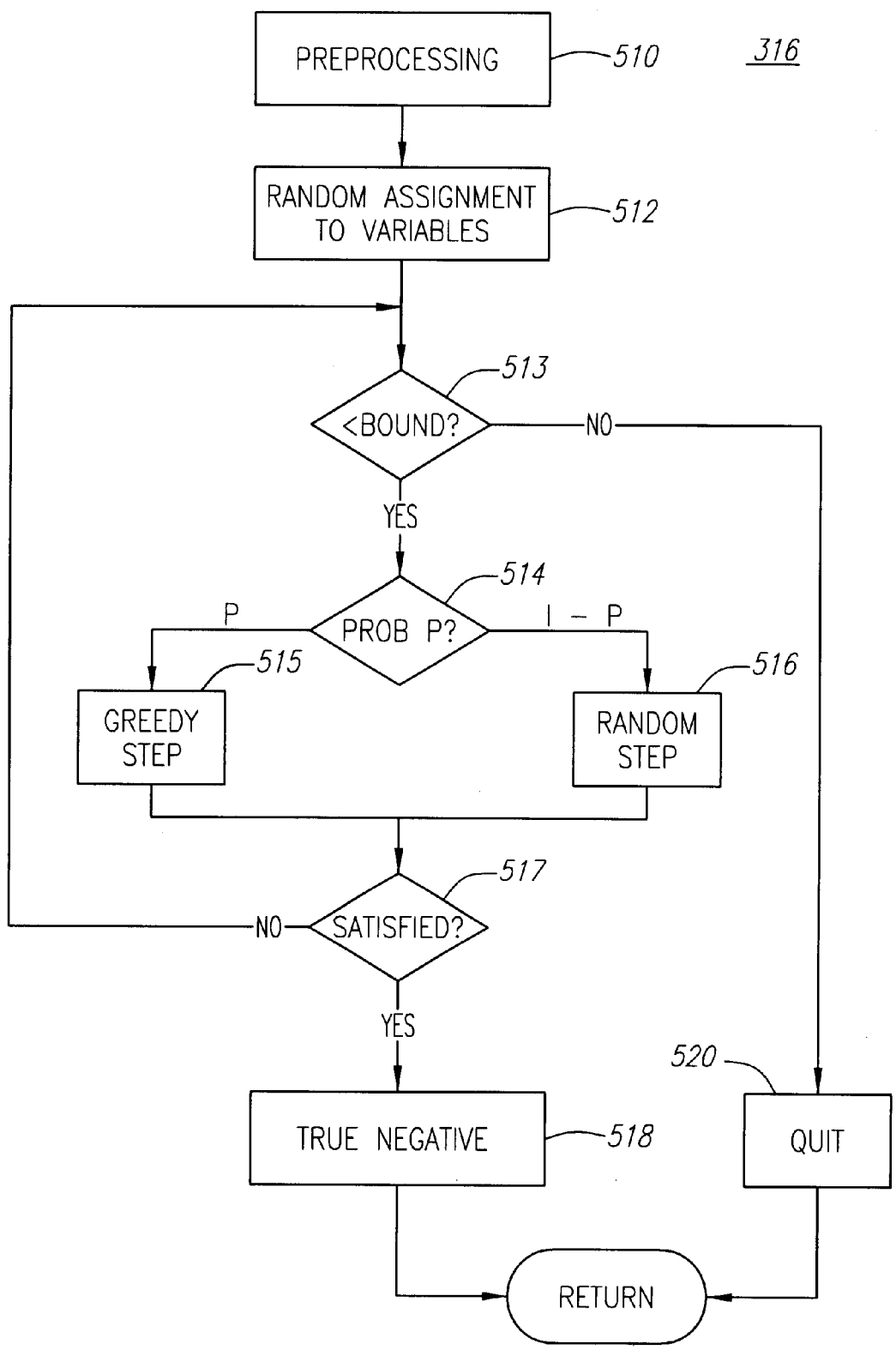
FIG. 5 is a flow chart illustrating steps for performing SAT-based resolution according to an embodiment of the present invention.

FIG. 5 is a flow chart illustrating steps for performing SAT-based resolution according to an embodiment of the present invention. The SAT method utilizes a randomized local search algorithm that is efficient for finding real negatives. This algorithm takes a set of m root BDDs in terms of variables representing primary inputs and other variables representing cutpoints, and p BDDs for each one of the cutpoints, and returns an assignment satisfying all the BDDs. Although a preferred embodiment of the present invention performs SAT as described with respect to FIG. 5, any automatic test pattern generation-(ATPG-) based method could be substituted instead.

First, preprocessing is performed 510 on the m root and p cutpoint BDDs. Preprocessing, in short, identifies BDD variables which are required to have a constant value of zero or one in order to find a satisfying assignment. These variables are called "constant" variables. Finding constant variables makes resolution easier by (1) reducing the sets of the BDDs; (2) eliminating some of the BDDS; and (3) turning some non-root BDDs into root BDDs.

Figure 6:
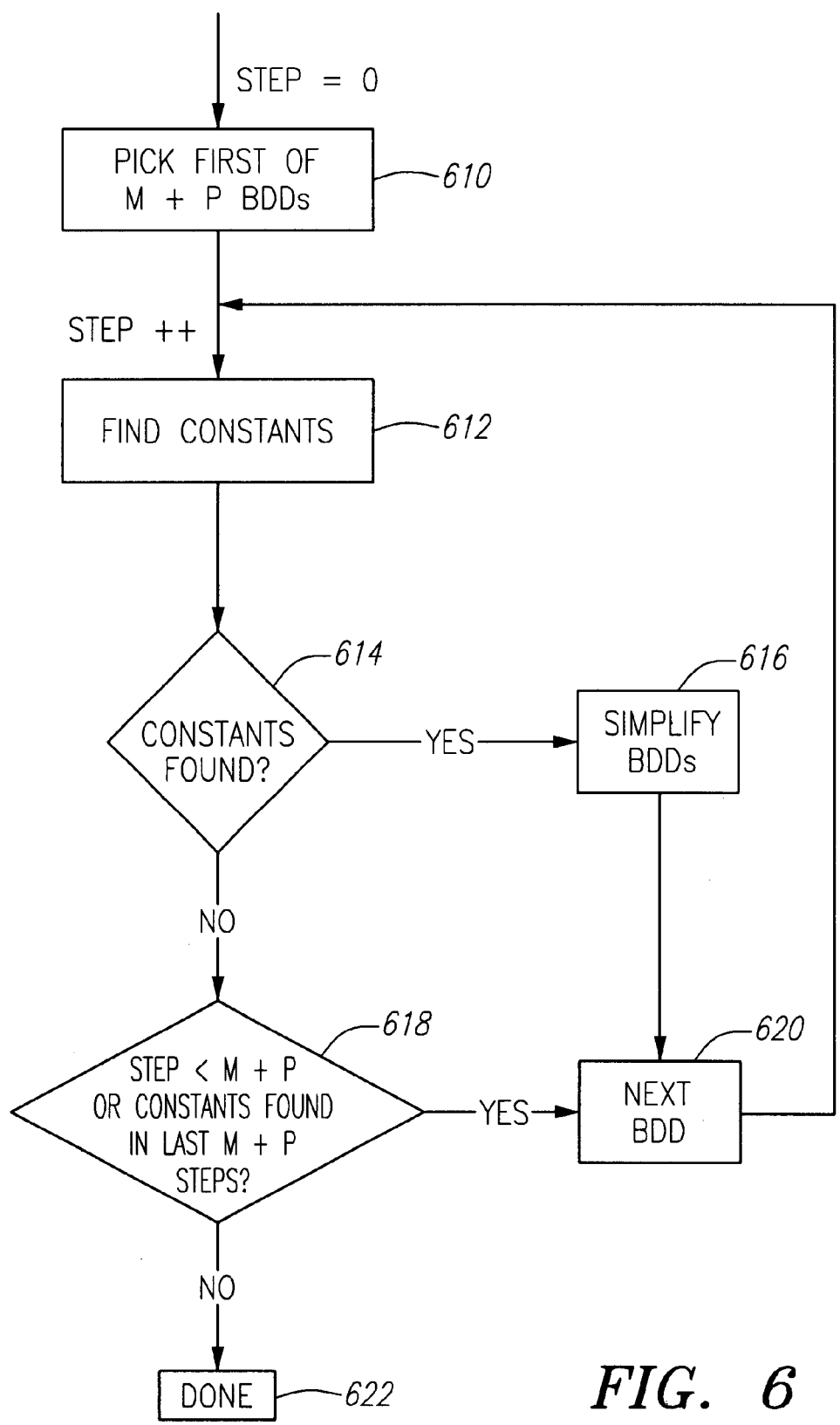
FIG. 6 is a flow chart illustrating steps for performing SAT preprocessing according to an embodiment of the present invention.
Figure 7A:
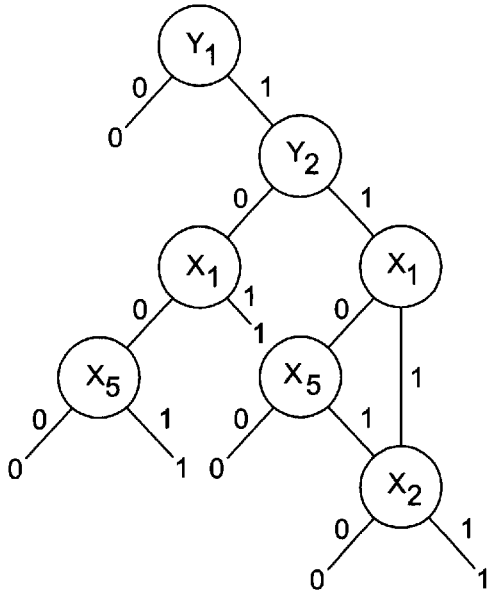
FIG. 7 illustrates an exemplary set of m root and p cutpoint BDDs for SAT preprocessing.
Figure 7B:
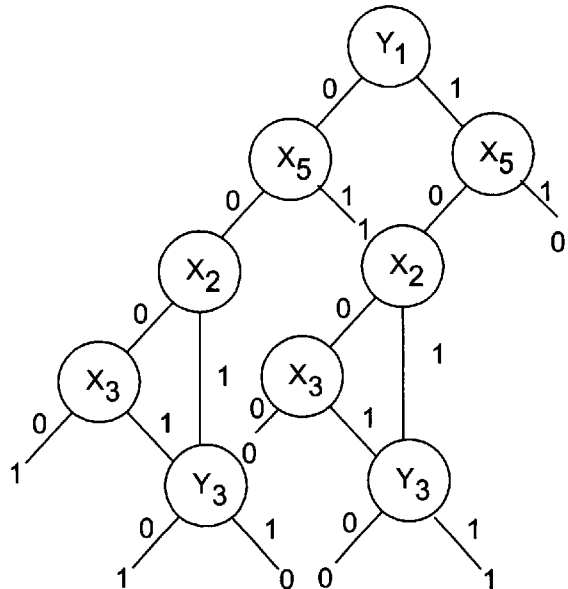
Figure 7C:
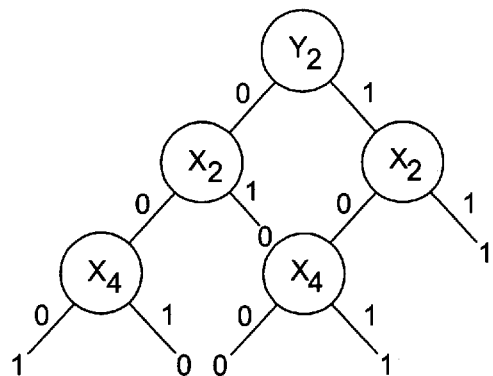
Figure 7D:
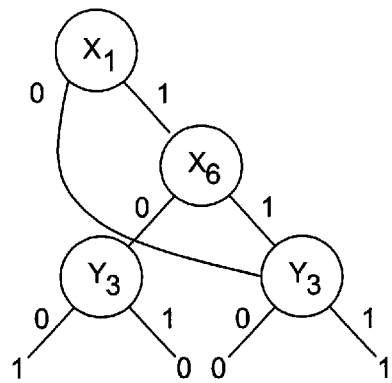

FIG. 6 is a flow chart illustrating steps for performing preprocessing according to an embodiment of the present invention and the Appendix contains pseudocode for performing preprocessing on a computer system. Preprocessing starts by choosing one of the m root and p cutpoint BDDs 610. The chosen BDD is examined 612 to determine whether it has any constants. As mentioned above, a variable of a BDD is a constant if it must have a constant value of zero or one in order to find a satisfying assignment. If one or more constant variables are found 614, then the constants are used to simplify 616 the m root and p cutpoint BDDs containing the constants. Then, another of the m root and p cutpoint BDDs is chosen 620 and examined for constants.

The above steps are repeated 618 for each of the m root and p cutpoint BDDs. When all of the BDDs have been examined and a constant was found in the last m+p iterations (steps), then the first chosen BDD is examined again and each BDD is considered in turn until the steps are repeated 618 m+p times without finding a constant (i.e., each BDD is examined without finding a constant). At this point, the maximally simplified set of m root and p cutpoint BDDs has been produced and preprocessing 510 is complete.

FIG. 7 illustrates an example of preprocessing using an exemplary set of m root and p cutpoint BDDs. For purposes of clarity, FIG. 7 illustrates a simplified version of BDDs called "Shannon Trees." In this example, there is initially one root and three cutpoint BDDs. FIG. 7A illustrates the root BDD ($BDD_0$) while FIGS. 7B–D illustrate the cutpoint BDDs ($BDD_1$–$BDD_3$). In addition, the clause represented by each BDD is illustrated beside that BDD.

Applying the steps illustrated by the flow chart of FIG. 6 to the BDDs of FIG. 7, the first variable of $BDD_0$, $y_1$, is considered. As shown in FIG. 7A, variable $y_1$ is a constant because $y_1$ must equal one in order for $BDD_0$ to evaluate to one. Accordingly, the BDDs containing $y_1$, $BDD_0$ and $BDD_1$, are simplified by removing the constant variable and all branches descending from the $y_1$=0 path. The simplified BDDs for $BDD_0$ and $BDD_1$ are respectively illustrated by FIGS. 7E and 7F.

There are no constants in $BDD_1$–$BDD_3$, so the simplified version of $BDD_0$ (FIG. 7E) is again examined for constant variables and $x_5$ is identified as having a constant value of zero. In addition, $y_3$ is identified as having a constant value of one. $BDD_0$, $BDD_1$, and $BDD_3$ are accordingly simplified with these constants, as respectively shown in FIGS. 7G, 7H, and 7I. FIG. 7I shows only a "1" because all of the variables in $BDD_3$ have been eliminated.

The simplified version of $BDD_0$ (FIG. 7G) is examined again for constant variables and $x_1$ is identified as a constant having a value of one. $BDD_0$ is simplified to produce the BDD illustrated in FIG. 7J. At this point, all constants have been identified and preprocessing is complete. As a result of the preprocessing, the set of BDDs is reduced to two root BDDs, $BDD_0$ and $BDD_1$, and one cutpoint BDD, $BDD_2$.

Returning to FIG. 5, after preprocessing 510 a random assignment is made to the variables in X∪Y 512. Then, for each iteration of the SAT method within a bounded loop 513, with probability P a greedy step 515 is taken 514, and, with probability 1–P, a random step is taken, toward satisfying the m root and p cutpoint BDDs in the simplified set. In a preferred embodiment of the present invention, P is ⅔.

The greedy step 515 reverses the assignment (i.e., toggles the value) of one variable so that a cost function representing how closely the current assignment is to an assignment which solves for [f(X,Y)≠g(X,Y)] is minimized. More specifically, the cost function first defines, for each BDD i, a MAX-COST[i] and a PATH-COST[i]. For a root BDD, the MAX-COST is equal to the number of variables in the BDD's support and the PATH-COST is equal to the Hamming distance of the current assignment to the BDD-leaf representing one. For each cutpoint BDD, the MAX-COST is equal to one less than the number of variables in the BDD's support and the PATH-COST is equal to the Hamming distance of the current assignment excluding the cutpoint variable to the BDD-leaf representing one.

To better understand the cost function, consider a set of m root BDDs and p cutpoint BDDs in light of the figures illustrated in FIGS. 7 and 8. FIG. 8A illustrates the root BDD, $BDD_0$, and FIGS. 7B–D illustrate the cutpoint BDDs, $BDD_1$–$BDD_3$. Assume the following random assignment is made to the BDDs: $y_1$=0, $y_2$=0, $y_3$=1, $x_1$=0, $x_2$=1, $x_3$=0, $x_4$=1, $x_5$=0, and $x_6$=0.

With this assignment, the costs of each BDD are:

TABLE 1

|  | $BDD_0$ | $BDD_1$ | $BDD_2$ | $BDD_3$ |
|---|---|---|---|---|
| MAX-COST | 5 | 4 | 2 | 2 |
| PATH-COST | 0 | 1 | 2 | 0 |

The PATH-COST of $BDD_1$ is "1" because the value of variable $y_3$ must be changed and the PATH-COST of $BDD_2$ is "2" because the values of variables $x_2$ and $x_4$ must be changed for the BDDs to evaluate to one.

By definition, the BDDs form the directed graph illustrated in FIG. 8B. BDD $BDD_0$ is at the top of the graph because it is a root BDD. $BDD_1$ is below $BDD_0$ because $BDD_1$ contains variable y, which appears in $BDD_0$. Likewise, $BDD_2$ is below $BDD_0$ because $BDD_2$ contains variable $y_2$. $BDD_3$ is below $BDD_1$ because $BDD_3$ contains variable $y_3$, which appears in $BDD_1$.

In the cost function, a BDD j is defined as NEEDED if it is a root BDD or if the PATH-COSTs of its ancestor BDDs in the directed graph are zero and the variable which it represents appears in the current assignment of an ancestor. Accordingly, $BDD_0$ is NEEDED because it is a root BDD and $BDD_1$ is needed because the PATH-COST of $BDD_0$ is zero and y, is in the current assignment.

A BDD j is defined as WASTED if an ancestor BDD has a PATH-COST greater than zero. Thus, $BDD_3$ is WASTED because BDD, has a PATH-COST of two. A BDD j is defined as UNNEEDED if it is neither NEEDED nor WASTED. $BDD_2$ is UNNEEDED.

The total cost of the current assignment is the sum of the PATH-COSTs of the NEEDED BDDs plus the sum of the MAX-COSTS of the WASTED BDDs. In the example of FIG. 8, the cost of the given assignment is: $0_{BDD0}+1_{BDD1}+0_{BDD2}+2_{BDD3}=3$. The lower the cost function, the better. If the cost function is equal to zero, then the cutpoint has been successfully resolved.

As stated above, the greedy step 515 reverses the assignment of one variable so that the cost function is minimized. In order to determine which variable to reverse, he greedy step 515 calculates the cost function after individually reversing the value of each input variable. FIG. 8C illustrates the resulting costs after reversing the assignment of each variable to the BDDs. As shown therein, reversing the assignment of $y_3$ or $x_5$ produces a cost of one. Accordingly, the greedy step reverses either y3 or x5. For either variable, the next iteration of the greedy step will pick $x_6=1$. The resulting cost will be equal to zero, indicating a satisfying assignment (a true negative).

As stated above, with probability 1–P 514, a random step 516 is taken towards satisfying the m root and p cutpoint BDDs. The random step picks one of the NEEDED BDDs (having a PATH-COST>0) and reverses the assignment of a random variable (excluding the cutpoint variable) within that BDD.

The number of moves spent in the greedy 515 and random 516 steps is bounded by a number proportional to the size and number of BDDs input to the SAT-based method in order to assure that the steps do not get stuck in endless loops. If the BDDs are satisfied 517 by the SAT method, a true negative has been found 518. If the BDDs are not satisfied within the bound number of steps, the SAT method quits out of the loop 520.

Figure 9:
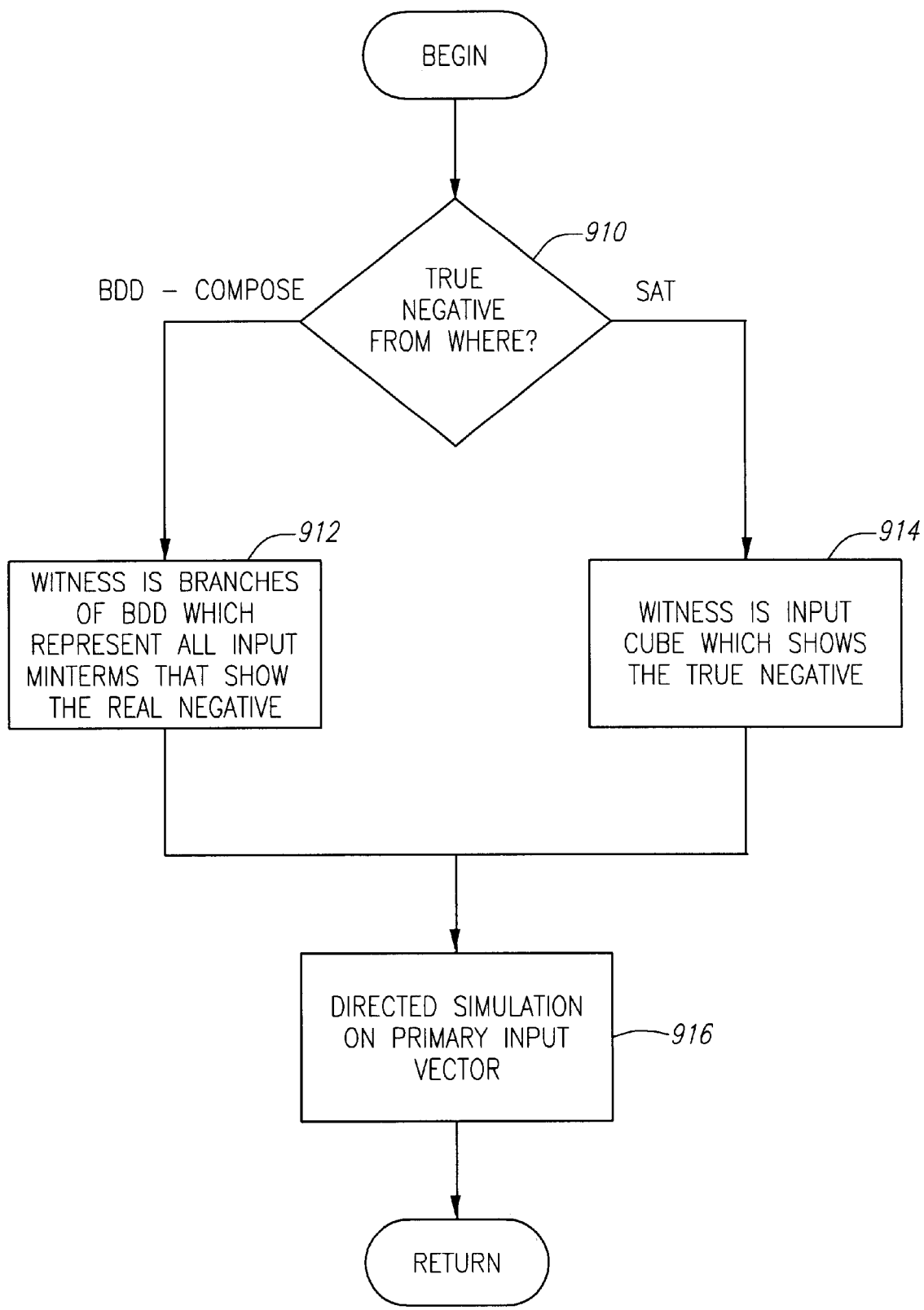
FIG. 9 is a flow chart illustrating steps for using directed simulation to refine cutpoint classes according to an embodiment of the present invention.

As described with respect to FIG. 2, directed simulation is used to refine 214 the cutpoint classes when a true negative is found. FIG. 9 is a flow chart illustrating steps for using directed simulation to refine cutpoint classes according to an embodiment of the present invention. To refine the cutpoint candidates, directed simulation using the witness to the true negative as the primary input vector is applied to the inputs of the netlists 916. When the true negative comes from the BDD composition method 910, the witness is the different branches of the BDD which represent all input minterms (i.e., the Boolean assignment to the entire set of input variables) that show the true negative 912. If the true negative comes from the SAT method 910, the witness is the input cube (i.e., the Boolean assignment to a subset of input variables) that shows the true negative 914. The directed simulation produces signatures in the netlists that are used to refine the existing cutpoint classes.

In sum, the present invention is a robust combinational equivalence checker having tight integration of BDD-composition based, SAT-based, and directed simulation-based verification methods. The use of the various methods are tightly interleaved. In addition, one method of cutpoint resolution, BDD-composition, is good for showing equivalencies, while another, SAT analysis, is good for showing inequivalencies. The operation of these two methods is enhanced by sharing information between the methods. Furthermore, the results of the cutpoint resolution methods are used to generate test vectors applied to the netlists during directed simulation. By sharing information between the various methods as shown herein, the present invention performs efficient and robust cutpoint resolution, thereby leading to an efficient and robust equivalence checker.

APPENDIX

```
define Preprocessing
    for (1 <= i <= m) FLAG[i] = ROOT; for (m < i <= m+p) FLAG[i] = NOT-ROOT
    for (1 <= i <= m) BDD[i] = i-th root BDD; for (m < i <= m+p) BDD[i] = i-th cutpoint
    BDD
    newConstants = { }
    do {
        foundNewConstant = false
        for (1 <= i <= m+p) {
            BDD[i] = substitute previously discovered constants into BDD[i]
            if (FLAG[i] = ROOT) {
                Do Root Preprocessing
            } else {
                if var-i is set to constant A {
                    FLAG[i] = ROOT
                    if (A = 0) BDD[i] = ~BDD[i]
                        Do Root Preprocessing
                } else {
                    Do CutpointBDD-Preprocessing
                }
            }
        }
    } while (foundNewConstant = true)
end-define
```

APPENDIX-continued

```
define Root-Preprocessing
    newConstants = newConstants union Find-Constants(BDD[i]) if (newConstants > 0)
    foundNewConstant = true
    if (BDD[i] = BDD[j]) {
        if (FLAG[j] = ROOT) eliminate BDD[j] if (FLAG[j] = NON-ROOT)
        add var-j = 1 to newConstants
        foundNewConstant = true
    } else if (BDD[i] = NOT of BDD[j]) {
        if (FLAG[j] = ROOT) return UNSATISFIABLE if (FLAG[j] = NON-ROOT)
        add var-j = 0 to newConstants
        foundNewConstant = true
    }
end-define
define CutpointBDD-Preprocessing
    if (BDD[i] = BDD[j]) {
        if (FLAG[j] = ROOT)
            add var-i = 1 to newConstants
            foundNewConstant = true
        if (FLAG[j] = NON-ROOT)
            add var-j = var-i to newConstants
            foundNewConstant = true
    } else if(BDD[i] = NOT of BDD[j]) {
        if (FLAG[j] = ROOT)
            add var-i = 0 to newConstants
            foundNewConstant = true
        if (FLAG[j] = NON-ROOT)
            add var-j = NOT of var-i to newConstants foundNewConstant = true
    }
end-define
define Find-Constants (input BDD)
    var-i = 0 is a constant if every path from the root of the BDD to the 1-leaf vertex
passes through var-i = 0 branch.
    var-i = 1 is a constant if every path from the root of the BDD to the 1-leaf vertex
passes through var-i = 1 branch.
    For any branch of the type (var-i = 0 to var-j),
        we mark the entries ONE-ARRAY[i] = MARKED, and
        we mark the entries ONE-ARRAY[k] = MARKED and ZERO-ARRAY[k] =
MARKED
        for all k such that i < k < j
    For any branch of the type (var-i = 1 to var-j),
        we mark the entries ZERO-ARRAY[i] = MARKED, and
        we mark the entries ONE-ARRAY[k] = MARKED and ZERO-ARRAY[k] =
MARKED
        for all k such that i < k < j
    For any branch of the type (var-i = 0 to 1-leaf),
        we mark the entries ONE-ARRAY[i] = MARKED, and
        we mark the entries ONE-ARRAY[k] = MARKED and ZERO-ARRAY[k] =
MARKED
        for all k such that i < k <= n
    For any branch of the type (var-i = 1 to 1-leaf)
        we mark the entries ZERO-ARRAY[i] = MARKED, and
        we mark the entries ONE-ARRAY[k] = MARKED and ZERO-ARRAY[k] =
MARKED
        for all k such that i < k <= n
end-define
```

What is claimed is:

1. A method of determining whether first and second netlists stored in a memory of a computer system are equivalent, the method comprising the steps of:

dividing cutpoint candidates in the first and second netlists stored in the memory into a plurality of classes;

resolving cutpoint candidates within a class of the plurality of classes to determine whether the cutpoint candidates are equivalent, the resolving step comprising the steps of:

if the cutpoint candidates are likely to be equivalent, performing a first type of cutpoint resolution on the class of cutpoint candidates;

if the cutpoint candidates are not likely to be equivalent, performing a second type of cutpoint resolution on the class of cutpoint candidates;

if the first type of cutpoint resolution does not resolve the cutpoint candidates, invoking the second type of cutpoint resolution with information learned by the first type of cutpoint resolution; and if the second type of cutpoint resolution does not resolve the cutpoint candidates, invoking the first type of cutpoint resolution with information learned by the second type of cutpoint resolution;

if the cutpoint candidates are inequivalent, generating an input pattern demonstrating the inequivalency and refining the cutpoint candidate classes with the input pattern; and if the cutpoint candidates are equivalent, marking the first and second netlists to indicate the equivalency.

2. The method of claim 1, wherein the dividing step comprises the steps of:

inputting random signals to the first and second netlists to create signatures for nets within the first and second netlists; and assigning nets within the first and second netlists having equal signatures to a same class.

3. The method of claim 1, wherein the resolving step further comprises the step of analyzing structures of the cutpoint candidates to determine whether the cutpoint candidates are likely to be equivalent.

4. The method of claim 1, further comprising the step of representing ones of the cutpoint candidates in the class as a set of m root and p cutpoint binary decision diagrams (BDDs), wherein m greater than or equal to one and p greater than or equal to zero.

5. The method of claim 4, wherein:
   a root BDD represents that the cutpoint candidates are inequivalent;
   the root BDD has a root node and a terminal node representing one; and
   the first type of outpoint resolution comprises the steps of performing BDD composition on the root BDD and halting BDD composition of the root BDD if a path containing only input variables exists from the root node to the terminal node representing one.

6. The method of claim 4, wherein the second type of cutpoint resolution comprises the steps of:
   simplifying the set of m root and p cutpoint BDDs;
   assigning values to variables in the m root and p cutpoint BDDs; and
   calculating a cost determined from the values of the variables in the m root and p cutpoint BDDs.

7. The method of claim 1, wherein the step of refining the cutpoint candidate classes comprises the steps of:
   performing directed simulation on the first and second netlists using the input pattern to change signatures of nets within the first and second netlists; and
   assigning nets within the first and second netlists having equal signatures to the same class.

8. A computer-readable medium having computer instructions stored thereon for causing a processor performing a series of acts to determine whether first and second combinational netlists comprised of a plurality of nets and stored in a memory of a computer system are equivalent, the series of acts comprising:
   applying input vectors to the first and second netlists stored in the memory to generate cutpoint candidates from the nets in the netlists;
   resolving the cutpoint candidates to determine whether the cutpoint candidates are true cutpoints by selectively invoking, depending on whether the cutpoint candidates are likely to be true cutpoints, first and second resolution techniques;
   if the cutpoint candidates are not true cutpoints, generating a witness illustrating that the cutpoint candidates are not true cutpoints and refining the cutpoint candidates with the witness; and
   determining whether the first and second combinational netlists are equivalent based on results of the resolving act and the refining act.

9. The computer-readable medium of claim 8, wherein the resolving act further comprises the acts of:
   determining whether the cutpoint candidates are true cutpoints using a composition-based technique in response to the cutpoint candidates likely to be true cutpoints;
   determining whether the cutpoint candidates are true cutpoints using a satisfiability-based technique in response to the cutpoint candidates not likely to be true cutpoints;
   invoking the composition-based technique using information learned from the satisfiabililty-based technique if the satisfiability-based technique fails to determine whether the cutpoint candidates are true cutpoints; and
   invoking the satisfiability-based technique using information learned from the composition-based technique if the composition-based technique fails to determine whether the cutpoint candidates are true cutpoints.

10. The computer-readable medium of claim 9, wherein the act of determining whether the cutpoint candidates are true cutpoints using a satisfiability-based technique further comprises the acts of:
    simplifying a set of m root and p cutpoint BDDs representing the cutpoint candidates;
    randomly assigning values to variables in the m root and p cutpoint BDDs; and
    calculating a cost determined from the values of the variables in the m root and p cutpoint BDDs.

11. The computer-readable medium of claim 9, wherein the act of determining whether the cutpoint candidates are true cutpoints using a composition-based technique further comprises the acts of:
    building a root BDD representing that the cutpoint candidates are inequivalent, having a root node, and having a terminal node representing one;
    composing the root BDD; and
    halting composing the root BDD if a path exists containing only input variables from the root node to the terminal node representing one.

12. The computer-readable medium of claim 9, wherein the act of generating a witness comprises the acts of:
    if the composition-based technique determines that the cutpoint candidates are not true cutpoints, generating the witness to be branches of a BDD representing all input minterms illustrating that the cutpoint candidates are not true cutpoints; and
    if the satisfiability-based technique determines that the cutpoint candidates are not true cutpoints, generating the witness to be an input cube illustrating that the cutpoint candidates are not true cutpoints.

13. The computer-readable medium of claim 8, wherein the refining act further comprises performing directed simulation on the first and second netlists using the witness to refine classes of cutpoint candidates.

14. A computer system for performing combinational verification of first and second netlists each comprising of a plurality of nets and stored in a memory of the computer system, the computer system comprising:
    an analysis module determining whether first and second nets respectively of the first and second netlists stored in the memory are likely to be equivalent;
    a BDD module for performing BDD composition of the first and second nets if the nets are likely to be equivalent to determine whether the nets are equivalent;
    a satisfiability module for performing satisfiability analysis of the first and second nets if the nets are not likely to be equivalent to determine whether the nets are equivalent;
    a passing module for passing information about the first and second nets between the BDD and the satisfiability modules if either the BDD module or the satisfiability module fails to determine whether the nets are equivalent; and
    a switch module for invoking the BDD module with the passed information if the satisfiability module fails to determine whether the nets are equivalent and for invoking the satisfiability module with the passed information if the BDD module fails to determine whether the nets are equivalent.

15. The computer system of claim 14 wherein the BDD module comprises:
    a module for building a root BDD representing that the first and second nets are inequivalent, having a root node, and having a terminal node representing one; and a module for halting BDD composition when there is a path from the root node to the terminal node representing one and consisting of only input variables.

16. The computer system of claim 14, wherein the satisfiability module comprises:
   a module for representing the first and second nets as a set of m root and p cutpoint BDDs;
   a module for assigning values to variables in the m root and p cutpoint BDDs; and
   a module for calculating a cost determined from the values of the variables in the m root and p cutpoint BDDs.

17. The computer system of claim 14, further comprising a selection module for identifying nets in the first and second netlists that are likely to be equivalent.

18. The computer system of claim 17, wherein the selection module comprises a module for performing random simulation on inputs of the first and second netlists to define classes of candidate nets within the first and second netlists that are likely to be equivalent.

19. The computer system of claim 17, wherein the selection module comprises a module for performing structural analysis of the first and second nets to determine whether the nets are likely to be equivalent.

20. The computer system of claim 14, wherein:
   if either the BDD module or the satisfiability module determines that the first and second nets are not equivalent, the respective module generates a witness so demonstrating; and
   the computer system further comprising a refine module for refining the plurality of nets in the first and second netlists into classes that are likely to be equivalent by applying the witness to inputs of the first and second netlists.

21. The computer system of claim 20, wherein:
   if the satisfiability module determines that the first and second nets are not equivalent, the witness is an input cube demonstrating the inequivalency; and
   if the BDD module determines that the first and second nets are not equivalent, the witness includes branches of the BDD representing all input minterms demonstrating the inequivalency.

22. A method of performing satisfiability analysis on a set of m root and p cutpoint BDDs representing a pair of cutpoint candidate BDDs stored in a memory of a computer system to determine whether the pair of cutpoint candidate BDDs are equivalent, the method comprising the steps of:
   simplifying the set of m root and p cutpoint BDDs;
   assigning random values to variables in the m root and p cutpoint BDDS;
   calculating a first cost of a first one of the pair of cutpoint candidate BDDS and a second cost of a second one of the pair of cutpoint candidate BDDs from the random values of the variables in the m root and p cutpoint BDDs; and
   determining whether the pair of cutpoint candidate BDDs are equivalent based on the first cost and the second cost.

23. The method of claim 22, wherein the simplifying step comprises the steps of:
   searching for a constant variable in the m root and p cutpoint BDDS; and
   removing the constant variable and branches descending from the constant variable from the m root and p cutpoint BDDs.

24. The method of claim 22, further comprising the steps of:
   with a first probability, calculating a plurality of costs by reversing the values of the variables in the m root and p cutpoint BDDs; and
   achieving a minimum cost by selectively reversing a value of a variable in the m root and p cutpoint BDDs.

25. The method of claim 24, further comprising the steps of:
   with a second probability, randomly selecting a variable in the m root and p cutpoint BDDs; and
   reversing a value of the selected variable.

26. A method of determining whether a first netlist and a second netlist stored in a memory of a computer system are equivalent, the method comprising the steps of:
   dividing cutpoint candidates in the first and second netlists stored in the memory into a plurality of classes;
   resolving cutpoint candidates within a class of the plurality of classes to determine whether the cutpoint candidates are equivalent, the resolving step comprising the steps of:
      performing a first type of cutpoint resolution on the class of cutpoint candidates in response to the cutpoint candidates being likely to be equivalent;
      performing a second type of cutpoint resolution on the class of cutpoint candidates in response to the cutpoint candidates being not likely to be equivalent;
      invoking the second type of cutpoint resolution with information learned by the first type of cutpoint resolution in response to the first type of cutpoint resolution not resolving the cutpoint candidates; and
      invoking the first type of cutpoint resolution with information learned by the second type of cutpoint resolution in response to the second type of cutpoint resolution not resolving the cutpoint candidates; and
   generating an indication demonstrating an inequivalency in response to the cutpoint candidates being inequivalent.

27. The method of claim 26, further comprising the step of refining the cutpoint candidate classes in response to the cutpoint candidates being inequivalent.

28. A computer system for performing combinational verification of a first netlist and a second netlist, each comprising a plurality of nets and stored in a memory of the computer system, the computer system comprising:
   an analysis module determining whether a first net of the first netlist and a second net of the second netlist are likely to be equivalent;
   a BDD module performing a BDD composition of the first net and the second net to determine whether the first net and the second net are equivalent in response to the first net and the second net being likely to be equivalent; and
   a satisfiability module performing a satisfiability analysis of the first and second nets to determine whether the first net and the second net are equivalent in response to the first net and the second net being unlikely to be equivalent 29. The computer system of claim 28, further comprising:
   a pass module for passing information about the first net and the second net between the BDD module and the satisfiability module in response to either the BDD module or the satisfiability module failing to determine whether the first net and the second net are equivalent.

30. The computer system of claim 28, further comprising a switch module, the switch module invoking the BDD module in response to the satisfiability module failing to determine whether the first net and the second net are equivalent and invoking the satisfiability module in response to the BDD module failing to determine whether the first net and the second net are equivalent.

* * * * *